United States Patent
Takenaka

(10) Patent No.: US 9,928,955 B2
(45) Date of Patent: Mar. 27, 2018

(54) ZERO-PHASE-SEQUENCE CURRENT TRANSFORMER, GROUND FAULT CURRENT DETECTION DEVICE, POWER CONDITIONER, AND METHOD FOR DETECTING MALFUNCTION OF ZERO-PHASE-SEQUENCE CURRENT TRANSFORMER

(71) Applicant: KYOCERA CORPORATION, Kyoto (JP)

(72) Inventor: Tetsuya Takenaka, Yamato (JP)

(73) Assignee: KYOCERA CORPORATION, Kyoto (JP)

( * ) Notice: Subject to any disclaimer, the term of this patent is extended or adjusted under 35 U.S.C. 154(b) by 328 days.

(21) Appl. No.: 14/424,824

(22) PCT Filed: Aug. 29, 2013

(86) PCT No.: PCT/JP2013/005105
§ 371 (c)(1),
(2) Date: Feb. 27, 2015

(87) PCT Pub. No.: WO2014/034117
PCT Pub. Date: Mar. 6, 2014

(65) Prior Publication Data
US 2015/0228407 A1    Aug. 13, 2015

(30) Foreign Application Priority Data

Aug. 29, 2012 (JP) .................................. 2012-189308

(51) Int. Cl.
*H01F 38/38* (2006.01)
*G01R 31/02* (2006.01)
(Continued)

(52) U.S. Cl.
CPC ........... *H01F 38/38* (2013.01); *G01R 31/025* (2013.01); *G01R 31/12* (2013.01); *G01R 31/40* (2013.01);
(Continued)

(58) Field of Classification Search
CPC ....... H01F 38/28; H01F 38/38; G01R 31/025; G01R 31/12; G01R 31/40; H02H 3/16; H02H 3/167; H02H 3/335; H02H 3/338
(Continued)

(56) References Cited

U.S. PATENT DOCUMENTS 3,585,452 A * 6/1971 Goodwin ............... H02H 3/347
                                                              361/44
5,488,303 A    1/1996 Bagalini
(Continued)

FOREIGN PATENT DOCUMENTS

| CN | 200410055873.9 A | 2/2005 |
|---|---|---|
| JP | S55-2348 A | 1/1980 |

(Continued)

OTHER PUBLICATIONS

Machine translation of Kazuya et al. Japanese Patent Document JP-2004-363036 A.*

(Continued)

*Primary Examiner* — Thienvu Tran
*Assistant Examiner* — Kevin J Comber
(74) *Attorney, Agent, or Firm* — Procopio Cory Hargreaves and Savitch LLP

(57) ABSTRACT

An abnormality occurring in a ZCT is detected simply and reliably. A zero-phase-sequence current transformer (ZCT) (11) detects zero-phase-sequence current in power wires inserted therethrough, and in addition to the power wires, has inserted therethrough a wire through which a constant DC offset current flows.

11 Claims, 5 Drawing Sheets

(51) Int. Cl.
 *G01R 31/12* (2006.01)
 *G01R 31/40* (2014.01)
 *H02H 3/16* (2006.01)
 *H01F 38/28* (2006.01)
 *H02H 3/33* (2006.01)

(52) U.S. Cl.
 CPC .............. *H01F 38/28* (2013.01); *H02H 3/16* (2013.01); *H02H 3/335* (2013.01); *H02H 3/338* (2013.01); *H02H 3/167* (2013.01)

(58) Field of Classification Search
 USPC .......................................................... 361/44
 See application file for complete search history.

(56) References Cited

U.S. PATENT DOCUMENTS

| 7,176,673 | B2 | 2/2007 | Tsubota et al. |
| 2005/0030005 | A1 | 2/2005 | Tsubota et al. |
| 2011/0221600 | A1 | 9/2011 | Kinsel et al. |

FOREIGN PATENT DOCUMENTS

| JP | H08-162332 A | 6/1996 |
| JP | 2003-217952 A | 7/2003 |
| JP | 2004-363036 A | 12/2004 |
| JP | 2006-187150 A | 7/2006 |

OTHER PUBLICATIONS

International Search Report; PCT/JP2013/005105; dated Dec. 3, 2013.
Written Opinion of the International Searching Authority; PCT/JP2013/005105; dated Dec. 3, 2013; with concise explanation.
Office Action dated May 5, 2016, issued in cunterpart Chinese Application No. 201380045462.9.
Extended European Search Report dated Apr. 4, 2016, issued by the European Patent Office for Counterpart European Application No. 13 833 373.7.

* cited by examiner

ZERO-PHASE-SEQUENCE CURRENT TRANSFORMER, GROUND FAULT CURRENT DETECTION DEVICE, POWER CONDITIONER, AND METHOD FOR DETECTING MALFUNCTION OF ZERO-PHASE-SEQUENCE CURRENT TRANSFORMER

CROSS-REFERENCE TO RELATED APPLICATION

This application claims priority to and the benefit of Japanese Patent Application No. 2012-189308 filed Aug. 29, 2012, the entire contents of which are incorporated herein by reference.

TECHNICAL FIELD

The present invention relates to a zero-phase-sequence current transformer, a ground fault current detection device that includes a zero-phase-sequence current transformer, a power conditioner that includes a zero-phase-sequence current transformer and a ground fault current detection device, and a method for detecting malfunction of a zero-phase-sequence current transformer.

BACKGROUND

A Zero-phase-sequence Current Transformer (ZCT) is generally provided in a power conditioner in order to detect ground fault current that flows when a ground fault occurs. When an abnormality occurs, however, such as the coil used in the ZCT becoming disconnected, a normal value ends up being output from the ZCT even when a ground fault occurs, and a ground fault cannot be detected. To address this issue, a known power conditioner includes an oscillation circuit that provides a pulse signal of a predetermined frequency to a series circuit formed by a ZCT and a resistor, a signal detection circuit that detects the pulse signal, a ground fault current detection circuit that detects ground fault current, and a self-diagnosis unit that detects whether the oscillation circuit and the ground fault current detection circuit technology has malfunctioned based on the signal detected by the signal detection circuit and the signal detected by the ground fault current detection circuit (for example, see Patent Literature 1).

CITATION LIST

Patent Literature 1: JP 2006-187150 A

SUMMARY

With the method disclosed in Patent Literature 1, however, an oscillation circuit that provides a pulse signal of a predetermined frequency and a detection circuit to detect the signal component are necessary, and the system, which further includes a detection algorithm, becomes quite complicated and thus leads to an increase in costs.

It is also conceivable to diagnose for malfunction regularly, yet doing so requires that operation of the power conditioner be temporarily stopped. Therefore, the power during diagnosis of malfunction in the device is needlessly wasted, making this approach disadvantageous for the user.

The present invention has been conceived in light of the above circumstances and provides a zero-phase-sequence current transformer, a ground fault current detection device, a power conditioner, and a method for detecting malfunction of a zero-phase-sequence current transformer that can simply and reliably detect when an abnormality has occurred.

In order to resolve the above problem, a zero-phase-sequence current transformer according to the present invention is for detecting zero-phase-sequence current in a plurality of power wires inserted therethrough, including: a wire inserted through the zero-phase-sequence current transformer in addition to the power wires, wherein a constant DC offset current flows through the wire.

In the zero-phase-sequence current transformer according to the present invention, the offset current may be determined by at least one factor selected from the group consisting of a dynamic range of zero-phase-sequence current to be detected by the zero-phase-sequence current transformer, a value of error current detected when current is balanced, and a power consumption due to the offset current.

A ground fault current detection device according to the present invention includes: a zero-phase-sequence current transformer configured to detect zero-phase-sequence current in a plurality of power wires inserted therethrough, wherein a wire is inserted through the zero-phase-sequence current transformer in addition to the power wires, and a constant DC offset current flows through the wire; and a ground fault current detection circuit configured to detect ground fault current based on the zero-phase-sequence current.

A power conditioner according to the present invention includes: at least one zero-phase-sequence current transformer configured to detect zero-phase-sequence current in a plurality of power wires inserted therethrough, wherein a wire is inserted through the zero-phase-sequence current transformer in addition to the power wires, and a constant DC offset current flows through the wire; and a ground fault current detection circuit configured to detect ground fault current based on the zero-phase-sequence current.

In the power conditioner according to the present invention, an abnormality may be determined to have occurred in the zero-phase-sequence current transformer when current detected by the ground fault current detection circuit substantially becomes zero.

In the power conditioner according to the present invention, a ground fault may be determined to have occurred when a magnitude of current detected by the ground fault current detection circuit exceeds a predetermined threshold.

In the power conditioner according to the present invention, the constant DC offset current may be operating current that drives at least one relay controlling output of the power wires.

In the power conditioner according to the present invention, each of a plurality of sets of the power wires may be capable of supplying power to a different supply destination, the at least one zero-phase-sequence current transformer may include a plurality of zero-phase-sequence current transformers that detect zero-phase-sequence current in the power wires in each of the sets, and the at least one relay may include a plurality of relays, each relay being driven by the power wires for which the relay controls output and by the constant DC offset current inserted through the zero-phase-sequence current transformer.

A method for detecting malfunction of a zero-phase-sequence current transformer according to the present invention is a method for detecting malfunction of a zero-phase-sequence current transformer with a ground fault current detection device, the ground fault current detection device comprising a zero-phase-sequence current transformer having inserted therethrough a plurality of power wires and a wire through which a constant DC offset current flows, and a ground fault current detection circuit configured to detect ground fault current based on zero-phase-sequence current detected by the zero-phase-sequence current transformer, the method including the steps of: acquiring a reference voltage output by the ground fault current detection device when the offset current is zero; monitoring an output voltage output by the ground fault current detection device when the offset current is flowing; and determining that there is a risk of malfunction in the zero-phase-sequence current transformer when current detected by the ground fault current detection device substantially becomes zero.

According to the present invention, an abnormality occurring in a ZCT can be detected simply and reliably.

BRIEF DESCRIPTION OF DRAWINGS

The present invention will be further described below with reference to the accompanying drawings, wherein.

DESCRIPTION OF EMBODIMENTS

The following describes an embodiment of the present invention in detail with reference to the drawings.

Figure 1:
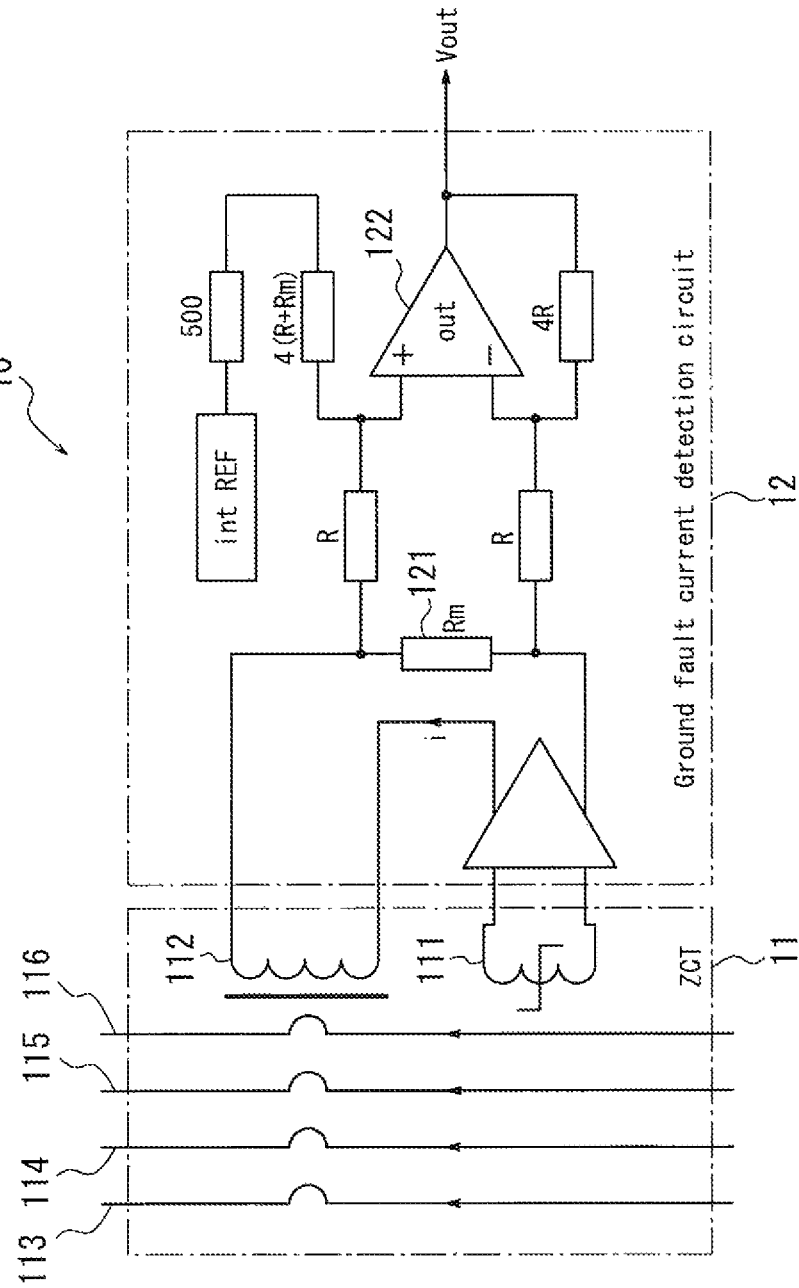
FIG. 1 is a circuit diagram of a ground fault current detection device according to an embodiment of the present invention.

FIG. 1 is a circuit diagram of a ground fault current detection device according to an embodiment of the present invention. As illustrated in FIG. 1, the ground fault current detection device 10 includes a ZCT 11 and a ground fault current detection circuit 12.

The ZCT 11 includes a first coil 111 and a second coil 112. A U-phase power wire 113, an O-phase power wire 114, a W-phase power wire 115, and an offset current wire 116 are inserted through a hollow portion of the ZCT 11. In the present embodiment, three power wires 113 to 115 are inserted through the ZCT 11 assuming a single-phase three-wire system for power distribution, yet in the case of a single-phase two-wire system for power distribution, the O-phase power wire 114 is unnecessary.

First, operations are described for a conventional ground fault current detection device 10 not provided with the offset current wire 116, or in which current is not applied to the offset current wire 116. When a ground fault has not occurred, no current flows in the O-phase, whereas opposite currents of equivalent magnitude flow in the U-phase and the W-phase. Therefore, the alternating current flowing in the power wires 113 to 115 inserted through the ZCT 11 is balanced, and the magnetic fields cancel each other out. Therefore, no change occurs in the magnetic field of the first coil 111, and current does not flow into the ground fault current detection circuit 12. On the other hand, when a ground fault occurs and ground fault current flows, a change occurs in the magnetic field of the first coil 111, and as a result, current flows in the ground fault current detection circuit 12.

In the following explanation, the output voltage of the ground fault current detection circuit 12 when current is not flowing in the ground fault current detection circuit 12 is designated as a reference voltage $V_{ref}$. The reference voltage $V_{ref}$ is the same value as the voltage of the positive input terminal of an op-amp 122.

When a ground fault occurs and ground fault current flows, the ground fault current detection circuit 12 applies current so as to cancel the change in magnetic field of the first coil 111. Due to this current, a difference in potential thus occurs between the two ends of a resistor 121, and in response to this difference in potential, the output voltage varies from the reference voltage $V_{ref}$. The ground fault current can be calculated from the variation in output voltage of the ground fault current detection circuit 12.

Here, the case of the second coil 112 being disconnected is considered. If the second coil 112 is disconnected in a conventional ZCT, then even if a ground fault occurs and the magnetic field of the first coil 111 changes, current cannot be applied to the ground fault current detection circuit 12. Hence, the output voltage of the ground fault current detection circuit 12 stays at the reference voltage $V_{ref}$. A ground fault therefore cannot be detected.

In order to resolve this problem, in the present invention, an offset current wire 116 is inserted through the ZCT 11, and a constant direct current (offset current) is continually applied to the offset current wire 116.

Due to flow of the offset current, the current flowing in the ZCT 11 becomes unbalanced. As a result, current flows into the ground fault current detection circuit 12, and the ground fault current detection circuit 12 outputs voltage in response to the offset current. The output voltage $V_{out}$ of the ground fault current detection circuit 12 is represented by Equation (1) below. Here, n is a value determined by the value of resistance connected to the op-amp 122. In the circuit illustrated in FIG. 1, n=4. The ± sign indicates the direction in which current flows.

$$V_{out}=V_{ref}\pm\text{direct current value}\times n \text{ [V]} \qquad (1)$$

When no ground fault has occurred, the output voltage $V_{out}$ of the ground fault current detection device 10 becomes $V_{ref}+n\cdot i_o$ due to the offset current $i_o$ flowing in the offset current wire 116. In the present embodiment, the direction in which the offset current $i_o$ flows is the direction such that the voltage $V_{out}$ in Equation (1) becomes larger than the reference voltage $V_{ref}$.

At the time of normal operation, the output voltage $V_{out}=V_{ref}+n\cdot i_o$, whereas if the second coil 112 is disconnected, the output voltage becomes $V_{out}=V_{ref}$. Therefore, when the reference voltage $V_{ref}$ is detected for a predetermined time, it can be determined that malfunction may have occurred in the ZCT 11.

In the present embodiment, the power supply voltage $V_c$ for the ground fault current detection circuit 12 is 5 V, the reference voltage $V_{ref}$ is 2.5 V, and in Equation (1), n=4. In this case, the output voltage $V_{out}$ of the ground fault current detection circuit 12 varies in a range of 0 V to 5 V. The ground fault current detection device 10 can detect a direct current of ±600 mA, and the output voltage $V_{out}$ varies in a range of 0.1 V to 4.9 V.

The offset current $i_o$ flowing in the offset current wire 116 needs to be determined taking into account the following three factors: the dynamic range of the current to be detected by the ground fault current detection circuit 12, error current $i_e$ detected when current is balanced, and power consumption due to the offset current $i_o$.

Per safety standards, for example a 200 mA current for 100 ms or a 100 mA current for 200 ms needs to be detected as ground fault current. Therefore, the specifications for the ground fault current detection circuit 12 require detection of a 200 mA current. Accordingly, the dynamic range of current to be detected by the ground fault current detection circuit 12 needs to be 200 mA or more. In other words, the offset current $i_o$ needs to satisfy a first condition of $V_{ref}+n \cdot (i_o+0.2) < V_c$.

If the offset current i is smaller than the error (error current $i_e$ detected when current is balanced) due, for example, to temperature characteristics of the components in the ground fault current detection device 10, then even if a malfunction has not occurred, the occurrence of a malfunction might be detected. Accordingly, the offset current $i_o$ needs to satisfy a second condition of $i_o > i_e$. The error current $i_e$ is, for example, approximately 20 mA to 30 mA.

If the offset current $i_o$ is increased, the power consumption of the ground fault current detection device 10 increases, leading to reduced efficiency. Therefore, the offset current $i_o$ is preferably as small a value as possible while still satisfying the above conditions 1 and 2. For example, the offset current $i_o$ is 70 mA.

Figure 2:
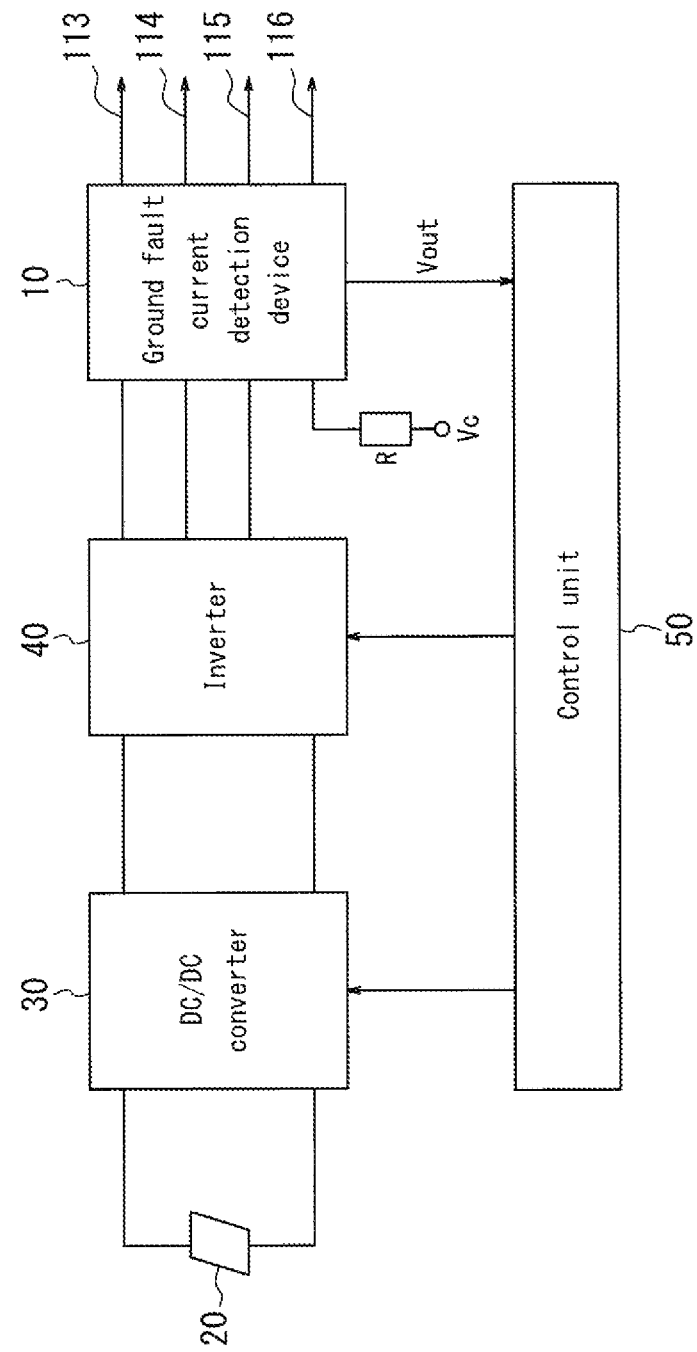
FIG. 2 is a block diagram illustrating the structure of a power conditioner according to an embodiment of the present invention.

FIG. 2 is a block diagram illustrating the structure of a power conditioner according to an embodiment of the present invention. As illustrated in FIG. 2, a power conditioner 1 includes the above-described ground fault current detection device 10, a DC/DC converter 30, an inverter 40, and a control unit 50.

The DC/DC converter 30 increases voltage so that the voltage of an input power source 20 is adjusted to a constant voltage. The input power source 20 is, for example, a solar cell string in which a plurality of solar cell modules that convert sunlight into DC power are connected in series.

The inverter 40 converts voltage increased by the DC/DC converter 30 from direct current to alternating current at a standard voltage. The standard voltage is, for example, the AC voltage in a commercial power grid. The AC voltage in a commercial power grid is voltage with an effective value of 100 V in Japan at a frequency of 50 Hz or 60 Hz.

The control unit 50 outputs a gate signal to the DC/DC converter 30 and controls operations of the DC/DC converter. The control unit 50 also outputs a gate signal to the inverter 40 and controls operations of the inverter 40.

The control unit 50 acquires the output voltage $V_{out}$ from the ground fault current detection device 10 and determines whether ground fault current has occurred and whether the ZCT 11 has malfunctioned based on variation in the voltage $V_{out}$.

Figure 3:
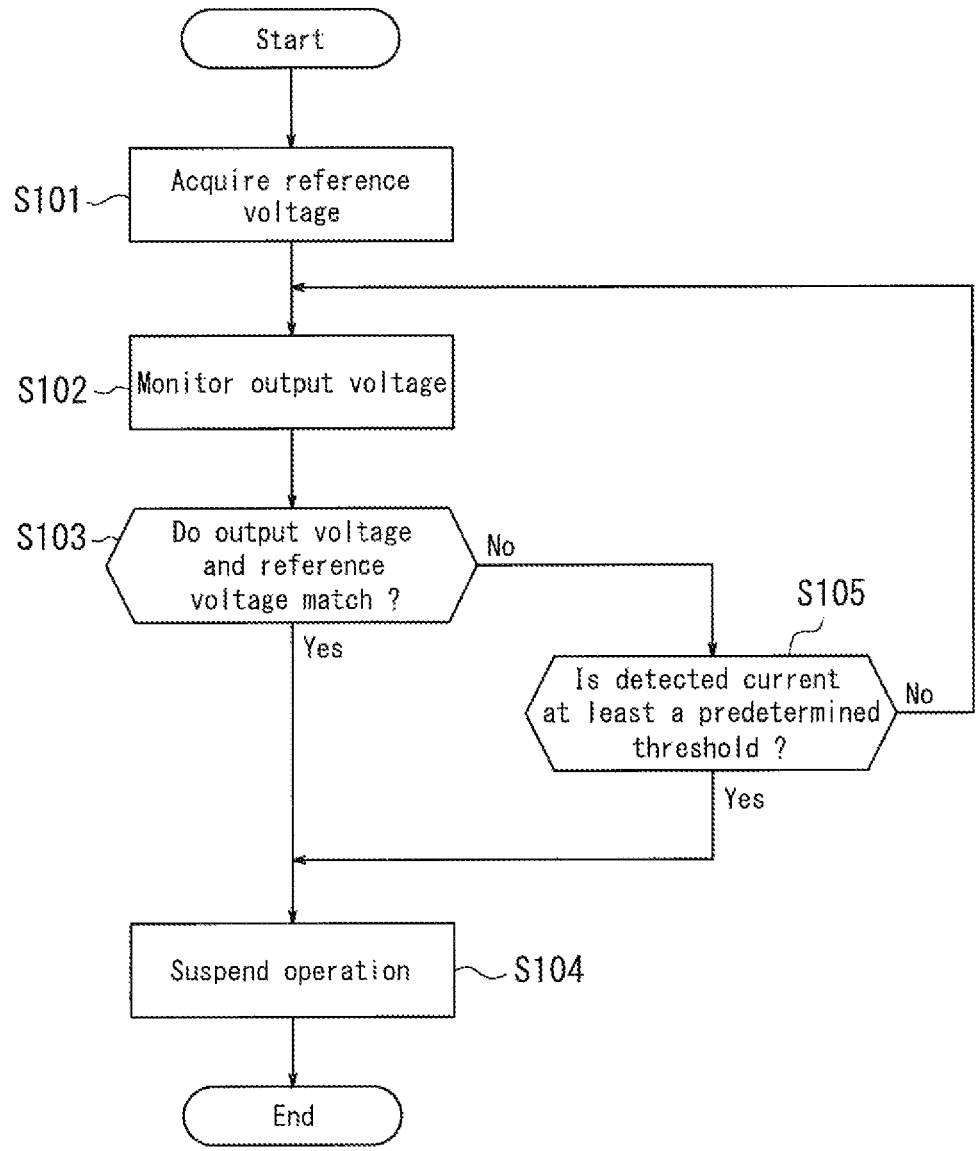
FIG. 3 is a flowchart of operations for ground fault detection using a ground fault current detection device according to an embodiment of the present invention.

FIG. 3 is a flowchart illustrating operations to detect an abnormal state (the occurrence of ground fault current and malfunction of the ZCT 11) using the ground fault current detection device 10 according to an embodiment of the present invention. The following describes an example of the control unit 50 in the power conditioner 1 illustrated in FIG. 2 detecting an abnormal state using the ground fault current detection device 10.

First, the control unit 50 acquires the reference voltage $V_{ref}$ output by the ground fault current detection device 10 when the offset current $i_o$ is 0 (step S101). As the reference voltage $V_{ref}$, the control unit 50 may acquire the voltage output by the ground fault current detection device 10 when the offset current $i_o$ is actually not applied to the offset current wire 116 or may acquire the voltage at the positive input terminal of the op-amp 122 in the ground fault current detection circuit 12, which is always maintained at a constant voltage regardless of the value of the offset voltage $i_o$.

Next, the control unit 50 monitors the output voltage $V_{out}$ output by the ground fault current detection device 10 when the offset current $i_o$ is applied to the offset current wire 116 (step S102). For example, if the offset current $i_o$ is 70 mA, then the output voltage $V_{out}$ is $2.5+4 \times 0.07=2.78$ V when no ground fault current is flowing. Zero-phase-sequence current $i_z$ is calculated as $(V_{out}-2.78)/4$.

In the present invention, malfunction of the ZCT 11 and a ground fault are detected as an abnormal state. When the value of the output voltage $V_{out}$ is equivalent to the reference voltage $V_{ref}$ for at least a predetermined length of time (for example 1 s), i.e. if the current detected by the ground fault current detection device 10 effectively becomes zero (step S103: Yes), then the control unit 50 determines that a malfunction may have occurred in the ZCT 11, suspends operation of the power conditioner 1 (step S104), and performs a malfunction diagnosis on the ZCT 11.

When the magnitude of the current detected by the ground fault current detection device 10 exceeds a predetermined threshold (step S105: Yes), a ground fault is determined to have occurred. For example, if zero-phase-sequence current $i_z$ exceeding 200 mA is detected for 100 ms, or if zero-phase-sequence current $i_z$ exceeding 100 mA is detected for 200 ms, then a ground fault is determined to have occurred. In this case, the control unit 50 suspends operation of the power conditioner 1 (step S104) and disconnects the power conditioner 1 from the commercial power grid.

As described above, the ZCT 11 according to the present invention includes, in addition to the power wires 113 to 115, the offset current wire 116 through which a constant DC offset current flows. By always applying a constant offset current $i_o$ to the ZCT 11 on purpose instead of zero current, an abnormality in the ZCT 11 can be detected simply and reliably.

The offset current $i_o$ can be set to an appropriate value by being determined by at least one of the following factors: the dynamic range of the zero-phase-sequence current $i_z$ to be detected by the ZCT 11, the value of the error current $i_e$ detected when current is balanced, and the power consumption due to the offset current $i_o$.

The ground fault current detection device 10 according to the present invention includes the ZCT 11 and the ground fault current detection circuit 12 that detects ground fault current based on the zero-phase-sequence current. By monitoring the output voltage of the ground fault current detection device 10, it is possible to discover a ground fault as well as malfunction of the ZCT 11.

The power conditioner 1 according to the present invention similarly can discover not only a ground fault but also malfunction of the ZCT 11 with the ground fault current detection device 10. Therefore, continued operation despite the occurrence of a ground fault can be prevented, thereby improving safety. Furthermore, malfunction of the ZCT 11 can be diagnosed without suspending operation of the power conditioner 1, thereby preventing a reduction in power generation efficiency due to diagnosis of malfunction.

A representative example has been described in the above embodiment, yet it will be apparent to a person of ordinary skill in the art that a variety of modifications and substitutions are possible within the spirit and scope of the present invention. Accordingly, the present invention is not limited to the above embodiment, but rather allows for a variety of modifications and changes without departing from the scope of the present invention.

Figure 4:
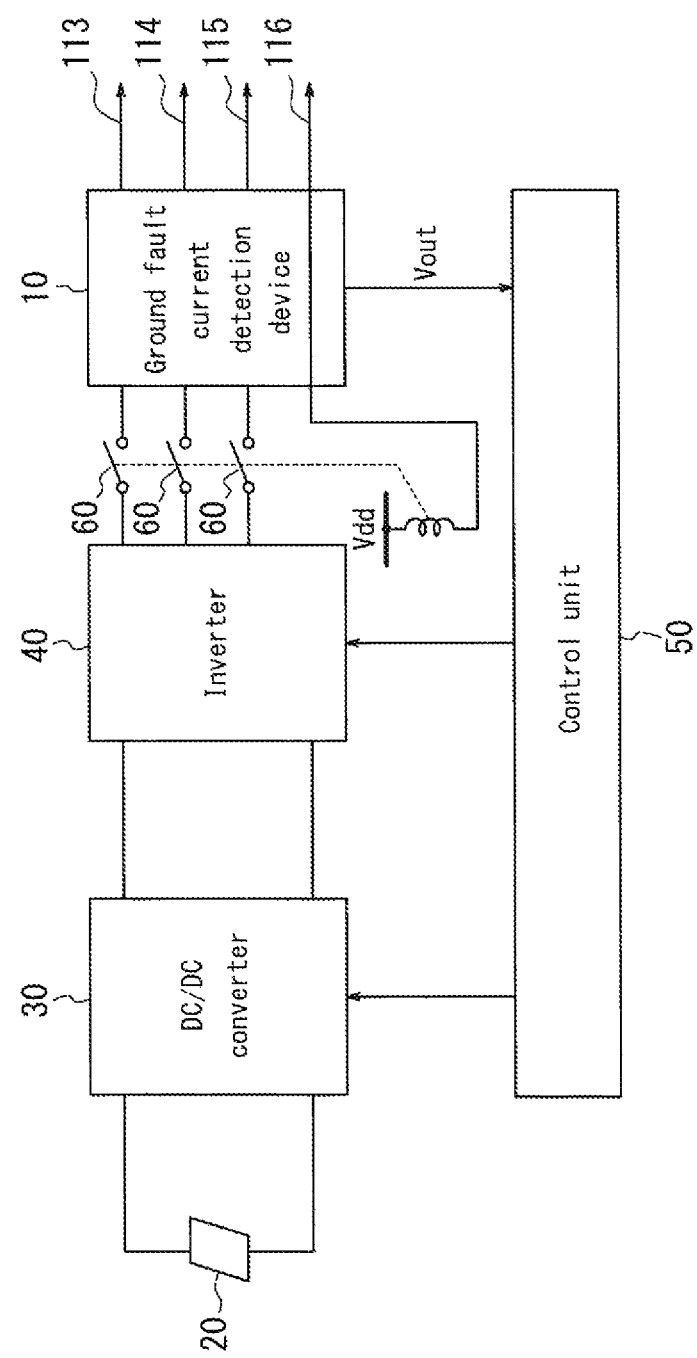
FIG. 4 is a block diagram illustrating the structure of Modification 1 to a power conditioner according to an embodiment of the present invention.

For example, in the present embodiment, a bias circuit is typically used to apply the offset current $i_o$ to the offset current wire 116, yet as illustrated in FIG. 4, operating current used to drive a relay 60 may be used as the offset current. In a structure adopting the relay 60 to switch between provision of power by the power conditioner 1 and suspension of power provision, operating current needs to be applied to the electromagnet of the relay 60 while the three power wires 113, 114, and 115 are carrying power. Channeling this operating current to be the offset current $i_o$ applied to the offset current wire 116 makes it possible to cut the consumption of power that would be used only to vary the offset from the total of the current flowing in the power wires 113, 114, and 115 inserted through the ZCT 11. Since the offset current does not represent a loss in this structure, the value of the offset current $i_o$ need not necessarily be minimized, unlike the present embodiment. In order to prevent the error current $i_e$ from being erroneously detected as the offset current $i_o$, however, the electromagnet operating current used as the offset current $i_o$ is preferably a larger value than the error current $i_e$. When the electromagnet operating current is equal to or less than the error current $i_e$, the offset current can be increased by inserting the offset current wire 116 through the ZCT 11 multiple times, thereby suppressing erroneous detection.

Figure 5:
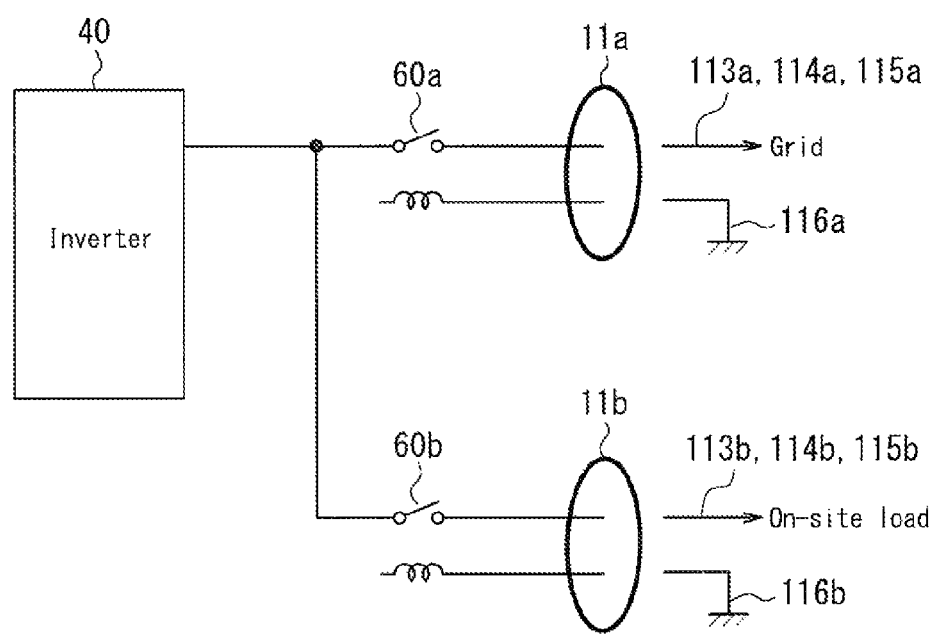
FIG. 5 is a block diagram illustrating the structure of Modification 2 to a power conditioner according to an embodiment of the present invention.

Furthermore, in a power conditioner that provides power separately to a plurality of supply destinations, such as the grid, an on-site load, or the like, the zero-phase-sequence current may be detected in sets of the power wires 113, 114, and 115 that provide power to different supply destinations to detect ground fault current in each set of the power wires 113, 114, and 115. For example, as illustrated in FIG. 5, such a structure includes a ZCT 11a that detects zero-phase-sequence current in power wires 113a, 114a, and 115a that supply power to the grid and a ZCT 11b that detects zero-phase-sequence current in power wires 113b, 114b, and 115b that supply power to an on-site load.

Operating current for relays 60a and 60b that switch between provision and suspension of power to the grid and the on-site load is applied to the offset current wires 116a and 116b that are inserted through the ZCTs 11a and 11b. In other words, the offset current wire 116a, which applies control current to the relay 60a that controls output of power by the power wires 113a, 114a, and 115a that provide power to the grid, is inserted through the ZCT 11a that detects zero-phase-sequence current in the power wires 113a, 114a, and 115a. The offset current wire 116b, which applies control current to the relay 60b that controls output of power by the power wires 113b, 114b, and 115b that provide power to the on-site load, is inserted through the ZCT 11b that detects zero-phase-sequence current in the power wires 113b, 114b, and 115b.

With this structure, ground fault current can be detected in the supply channels to both the grid and to an on-site load capable of autonomous operation in a power conditioner that, during grid connection, supplies power to the grid and cuts off a direct connection to the on-site load capable of autonomous operation and that, during autonomous operation, cuts off the power supply to the grid and directly connects to the on-site load capable of autonomous operation. Furthermore, this structure makes it possible to cut the consumption of power that would be used only to vary the bias point of the ZCTs 11a and 11b.

REFERENCE SIGNS LIST

1: Power conditioner
10: Ground fault current detection device
11, 11a, 11b: ZCT (zero-phase-sequence current transformer)
12: Ground fault current detection circuit
20: Input power source
30: DC/DC converter
40: Inverter
50: Control unit
60, 60a, 60b: Relay
111: First coil
112: Second coil
113, 113a, 113b: U-phase power wire
114, 114a, 114b: O-phase power wire
115, 115a, 115b: W-phase power wire
116, 116a, 116b: Offset current wire
121: Resistor
122: Op-amp

The invention claimed is:

1. A system comprising:
a zero-phase-sequence current transformer for detecting zero-phase-sequence current in a plurality of wires, the zero-phase-sequence current transformer comprising an insert portion configured to receive the plurality of the power wires and an offset current wire, wherein an offset current having constant direct current (DC) flows through the offset current wire; and
a ground fault current detection circuit configured to detect ground fault current based on the zero-phase-sequence current; and
a controller configured to determine that a disconnection of a coil in the zero-phase-sequence current transformer has occurred once direct current detected by the ground fault current detection circuit becomes substantially zero for at least a predetermined length of time.

2. The system according to claim 1, wherein the offset current is determined by at least one factor selected from the group consisting of a dynamic range of zero-phase-sequence current to be detected by the zero-phase-sequence current transformer, a value of error current detected when current is balanced, and a power consumption due to the offset current.

3. The system according to claim 1, wherein the controller is configured to determine that the disconnection of the coil in the zero-phase-sequence current transformer has occurred once direct current detected by the ground fault current detection circuit changes from a substantially non-zero direct current to a substantially zero direct current for at least a predetermined length of time.

4. A method for detecting malfunction of the zero-phase-sequence current transformer of the system according to claim 1, the method comprising:
acquiring a reference voltage output by the ground fault current detection device when the offset current is zero;
monitoring an output voltage output by the ground fault current detection device when the offset current is flowing; and
determining that there is malfunction in the zero-phase-sequence current transformer once direct current detected by the ground fault current detection device becomes substantially zero for at least a predetermined length of time.

5. A power conditioner comprising:
a plurality of first power wires;
a first offset current wire, wherein a first offset current having constant direct current (DC) flows through the first offset current wire;
a first zero-phase-sequence current transformer for detecting first zero-phase-sequence current in the plurality of the first power wires, comprising: an first insert portion receiving the plurality of the first power wires and the first offset current wire;

a ground fault current detection circuit configured to detect ground fault current based on the first zero-phase-sequence current; and a controller configured to determine that a disconnection of a coil in the first zero-phase-sequence current transformer has occurred once direct current detected by the ground fault current detection circuit becomes substantially zero for at least a predetermined length of time.

6. The power conditioner according to claim 5, wherein the controller is further configured to determine that a ground fault has occurred when a magnitude of current detected by the ground fault current detection circuit exceeds a predetermined threshold.

7. The power conditioner according to claim 5, further comprising:

a first relay controlling output of the plurality of the first power wires, wherein the first offset current is operating current that drives the first relay.

8. The power conditioner according to claim 7, further comprising:

a plurality of second power wires;

a second offset current wire, wherein a second offset current having constant DC flows through the second offset current wire;

a second zero-phase-sequence current transformer for detecting second zero-phase-sequence current in the plurality of the second power wires, wherein the second zero-phase-sequence current transformer comprises a second insert portion receiving the plurality of the second power wires and the second offset current wire; and a second relay controlling output of the plurality of the second power wires, wherein the second offset current is operating current that drives the second relay.

9. The power conditioner according to claim 5, wherein the first insert portion comprises a hollow portion receiving the plurality of the first power wires and the first offset current wire.

10. The power conditioner according to claim 5, wherein the controller is further configured to suspend operation of the power conditioner when current detected by the ground fault current detection circuit substantially becomes zero.

11. The power conditioner according to claim 5, wherein the controller is further configured to suspend operation of the power conditioner when a magnitude of current detected by the ground fault current detection circuit exceeds a predetermined threshold.

* * * * *